United States Patent [19]

Kraft

[11] 4,149,219
[45] Apr. 10, 1979

[54] FLEXIBLE PRINTED CIRCUIT BOARD ASSEMBLY

[75] Inventor: Robert W. Kraft, Indianapolis, Ind.

[73] Assignee: The United States of America as represented by the Secretary of the Navy, Washington, D.C.

[21] Appl. No.: 879,925

[22] Filed: Feb. 22, 1978

[51] Int. Cl.² ............................................. H05K 7/20
[52] U.S. Cl. ..................................... 361/386; 361/398
[58] Field of Search ......................... 174/68.5, 16 HS; 361/380, 381, 386, 388, 389, 392, 398, 412, 415

[56] References Cited

U.S. PATENT DOCUMENTS

| | | | |
|---|---|---|---|
| 3,766,439 | 10/1973 | Isaacson | 361/398 |
| 3,806,767 | 4/1974 | Lehrfeld | 361/398 |
| 3,883,834 | 5/1975 | Osteen | 174/16 HS |
| 3,971,127 | 7/1976 | Giguere | 361/398 |

Primary Examiner—Gerald P. Tolin
Attorney, Agent, or Firm—R. S. Sciascia; Paul S. Collignon

[57] ABSTRACT

A flexible printed circuitry board assembly having a plurality of rigid printed circuit boards spaced apart but mechanically and electrically connected by a thin flexible printed circuitry board which is bonded to one side of each rigid board. The assembled board is reverse-bonded to align the rigid boards in stacked, parallel positions and are held in position by a pair of metallic support plates. A heat sink, having a plurality of resilient fingers, is attached to each support plate and the resilient fingers support the assembled board within a metallic housing and transfer heat from the assembled board to the housing.

3 Claims, 6 Drawing Figures

FLEXIBLE PRINTED CIRCUIT BOARD ASSEMBLY

BACKGROUND OF THE INVENTION

The present invention relates to a printed circuitry board assembly and more particularly to a flexible printed board assembly which can be reversed-bended in order to occupy a minimum of space.

There is a constant demand for smaller electrical and electronic components, particularly in the aircraft and missile fields, as weight is of extreme importance. One concept of microelectronics which has been recently developed and which offers a great reduction in size and weight of electronic units is that of integrated circuitry which is formed on insulated bases such as glass, fused silica, or ceramic substrates. Integrated circuitry includes a number of active and passive components which are fabricated by one or more of a combination of several thin film deposition techniques onto a glass or ceramic substrate.

The first printed circuitry boards were made of laminated rigid material and later a standardized plug-in module was made and widely used. In recent years, flexible boards have been added to the art, as these boards can be arranged in various shapes to conserve space and to fit into various shaped containers.

SUMMARY OF THE INVENTION

The present invention relates to a printed circuitry board and more particularly to a flexible printed circuitry which will occupy a minimum amount of space.

A plurality of rigid printed circuitry boards are spaced apart and are mechanically and electrically connected together by bonding to a thin flexible printed circuitry board. The assembled board is reverse-bended at the areas between the rigid boards and the rigid boards are aligned in stacked, parallel positions. The rigid boards are held in position by a pair of metallic support plates which engage each rigid board. A heat sink, having a plurality of resilient fingers, is attached to each support plate, and the resilient fingers support the assembled board within a metallic housing and transfer heat from the assembled board to the housing.

It is therefore a general object of the present invention to provide a flexible printed circuitry board which, after assembly, becomes a rigid assembly board which occupies a minimum amount of space.

Other objects, advantages and novel features of the present invention will become apparent from the following detailed description of the invention when considered in conjunction with the accompanying drawings.

DESCRIPTION OF THE PREFERRED EMBODIMENT

Figure 1:
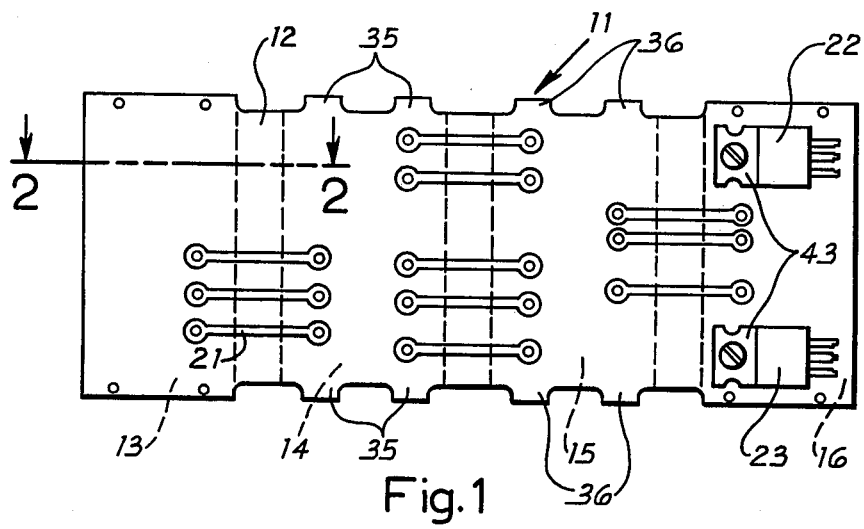
FIG. 1 is a top plan view of a printed circuit board assembly in an unfolded position.
Figure 2:
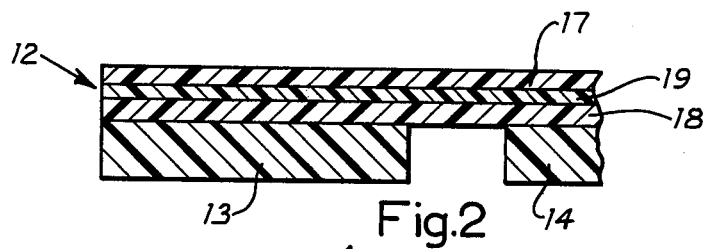
FIG. 2 is a sectional view taken on line 2—2 of FIG. 1.
Figure 5:
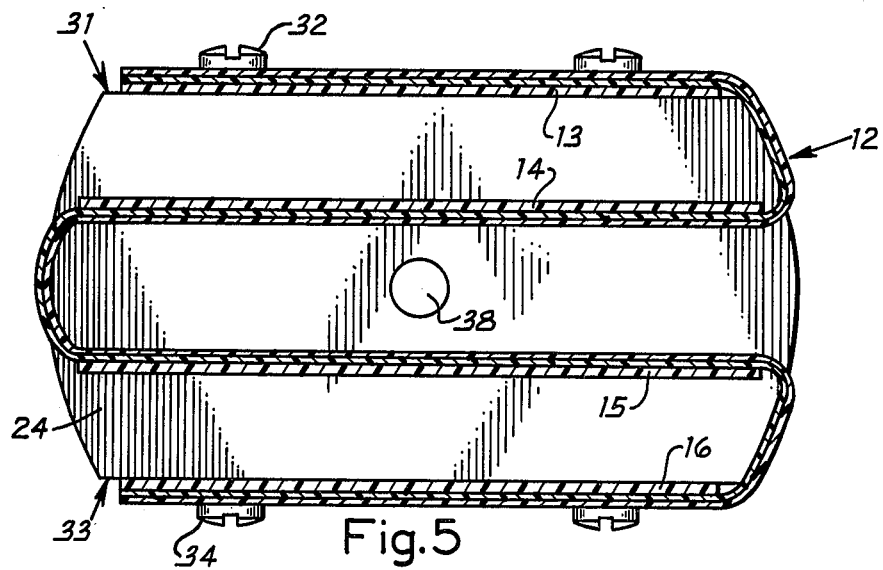
FIG. 5 is a sectional view taken on line 5—5 of FIG. 4.

Referring first to FIGS. 1 and 2 of the drawings, there is shown a printed circuitry board assembly 11 which has a flexible section 12 and four rigid printed circuitry boards 13, 14, 15, and 16. Rigid boards 13, 14, 15, and 16 are spaced sufficiently apart from one another so that the assembly can be reversed-bent, as best shown in FIG. 5 of the drawing. The embodiment of the invention shown in FIGS. 1 and 2 of the drawings has a flexible section 12 which is of multi-layer construction, which construction is well-known in the art, and the embodiment shown is comprised of two flexible printed circuitry boards 17 and 18 which are separated by an insulator 19. By way of example, board 17 might have a circuit pattern on both sides and, board 18 might have a circuit pattern on the inner side, and the various boards might be electrically connected by plated-through holes, a technique which is well-known in the art. For sake of clarity, the various conductors and electrical components which might be provided on boards 12, 13, 14, 15, and 16 have been omitted with the exceptions that a few conductors 21 are shown which bridge the space between adjacent rigid boards 13, 14, 15, and 16, and also a pair of transistors 22 and 23 are shown mounted on board 17, as these transistors are discussed later in conjunction with a heat sink. By way of example, board 12 might have a total thickness of 0.015 inches and boards 17 and 18 might be made of thin laminated plastic sheet which is metal clad. Sheet 19, which serves as an insulator, might also be a thin plastic sheet, but does not have any metal cladding. Rigid boards 13, 14, 15, and 16 might be about 0.015 inches thick and also would have metal cladding on its outer surface. The various circuitry patterns might be etched on boards 17 and 18, and also on rigid boards 13, 14, 15, and 16, by methods well known in the art.

Figure 4:
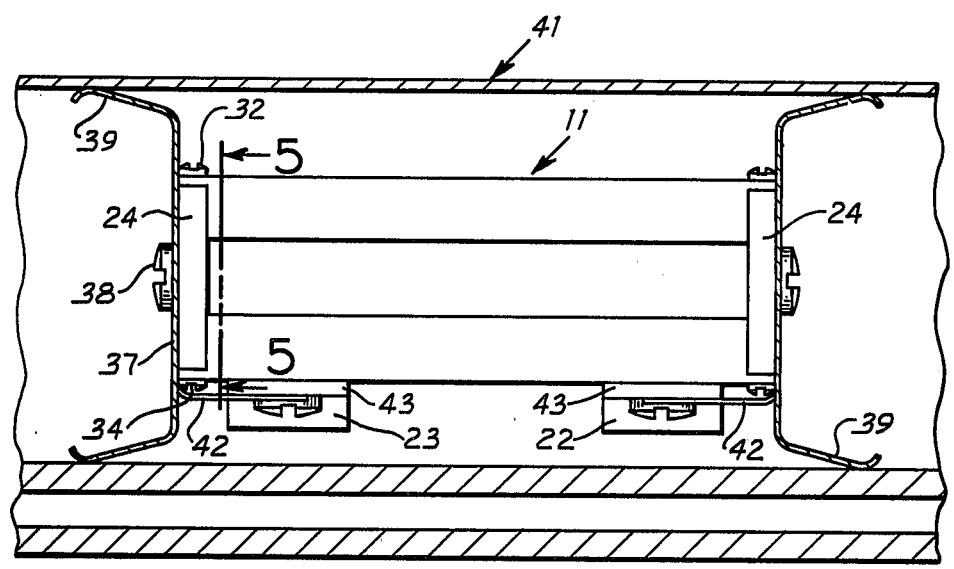
FIG. 4 is a longitudinal sectional view taken on line 4—4 of FIG. 3.
Figure 6:
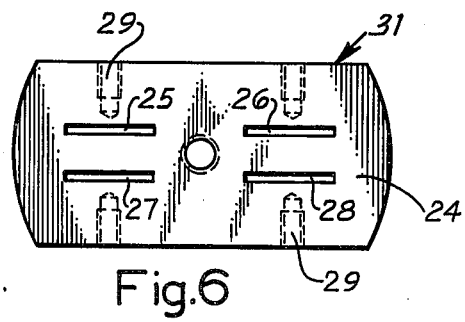
FIG. 6 is a front view of an end support plate.

Referring now to FIGS. 4, 5, and 6, it can be seen that printed circuit board 11 is reversed-bended, by bending at the spaces between the adjacent rigid boards 13, 14, 15, and 16, and these boards then become parallel and spaced apart from one another. Boards 13, 14, 15, and 16 are held in parallel position by two end support plates 24. As best shown in FIGS. 5 and 6 of the drawings, each support plate 24 is provided with slots 25, 26, 27, and 28 and also the top and bottom surfaces each have two blind threaded holes 29. Rigid board 13 is attached to the top surface 31 of each support plate 24 by screws 32 which threadedly engages in tapped holes 29, and rigid board 16 is attached to the bottom surface 33 of each support plate 24 by screws 34. Rigid boards 14 and the flexible board above it are provided with a pair of tabs 35 on each side and, likewise, rigid board 15 and the flexible board about it are provided with a pair of tabs 36 on each side. Tabs 35 engage in slots 25 and 26 of each support plate 24 and tabs 36 engage in slots 27 and 28 of each support plate 24 whereby end plates 24 position and support the printed circuitry board assembly 11.

Figure 3:
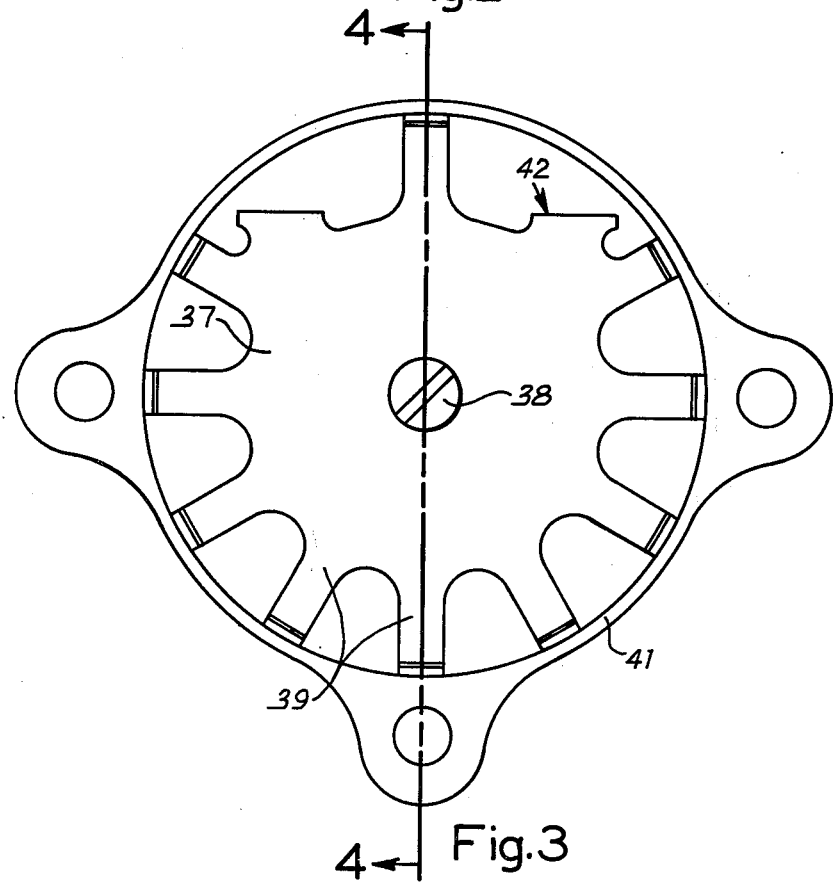
FIG. 3 is an end view of a heat sink inside a cylindrical housing.

Referring now to FIGS. 3 and 4 of the drawings, a heat sink 37 is attached to each end support plate 24 by a screw 38. Each heat sink 37 is provided with a plurality of resilient fingers 39 which contact the inner periphery of a metallic housing 41. A contact arm 42 is also provided on each heat sink 37, and contact arm 42 engages a metal base 43 which is attached to each transistor 22 and 23, which normally are the greatest source of heat on a printed circuitry board assembly.

The present invention has a particular advantage in that all mounting of components and any necessary soldering can be made with the printed circuitry board being in a flat position, as shown in FIG. 1 of the drawings. After board 11 is completely assembled, it can be folded and mounted to the two support plates 24, as shown in FIG. 5 of the drawings. The two heat sinks 37 are then mounted one each to each support plate 24. It can be seen in FIGS. 3 and 4 of the drawings, that the two heat sinks center and support the assembly inside housing 41 and, in addition, transfer heat from the assembly to housing 41.

It can thus be seen that the present invention provides a small, compact electrical assembly which is convenient to work on during manufacture and, after fully assembled, occupies a minimum amount of space.

Obviously many modifications and variations of the present invention are possible in the light of the above teachings. It is therefore to be understood that the invention may be practiced otherwise than as specifically described.

I claim:

1. A flexible printed circuit board assembly comprising,
    a multi-layer flexible printed circuit board,
    a plurality of rigid printed circuit boards bonded to said multi-layer flexible printed circuit board, said rigid printed circuit boards being spaced apart from one another and said multi-layer flexible printed circuit board being reverse-bended at the spaces between said rigid printed circuit boards to align said rigid printed circuit boards in stacked parallel positions,
    first and second metallic end plates attached to said flexible and said rigid printed circuit boards for maintaining said boards in said stacked parallel positions,
    a cylindrical housing surrounding said flexible and rigid printed circuit boards, and
    a first metallic heat sink attached to said first end plate and a second metallic heat sink attached to said second end plate, said metallic heat sinks each having a plurality of resilient fingers engaging the inside surface of said cylindrical housing for positioning said printed circuit board assembly within said housing and for transferring heat from said assembly to said housing.

2. A flexible printed circuit board assembly comprising,
    a flexible printed circuit board,
    a plurality of rigid printed circuit boards attached to said flexible printed circuit board, said rigid printed circuit boards being spaced apart from one another and said flexible printed circuit board being reverse-bended at the spaces between said rigid printed circuit boards to align said rigid printed circuit boards in stacked parallel positions,
    first and second metallic end plates,
    means for attaching said flexible printed circuit board and said rigid printed circuit boards to said end plates,
    a first metallic heat sink attached to said first end plate, and
    a second metallic heat sink attached to said second end plate.

3. A flexible printed circuit board assembly comprising,
    a flexible printed circuit board,
    a plurality of rigid printed circuit boards attached to said flexible printed circuit board, said rigid printed circuit boards being spaced apart from one another and said flexible printed circuit board being reverse-bended at the spaces between said rigid printed circuit boards to align said rigid printed circuit boards in stacked parallel positions,
    first and second metallic end plates,
    means for attaching said flexible printed circuit board and said rigid printed circuit boards to said end plates,
    a cylindrical housing surrounding said flexible and rigid printed circuit boards, and
    a first metallic heat sink attached to said first end plate and a second metalic heat sink attached to said second end plate, said metallic heat sinks each having a plurality of resilient fingers engaging the inside surface of said cylindrical housing for positioning said printed circuit board assembly within said housing and for transferring heat from said assembly to said housing.

* * * * *